(12) United States Patent
Dong et al.

(10) Patent No.: US 9,694,396 B2
(45) Date of Patent: Jul. 4, 2017

(54) STRIPPING APPARATUS AND METHOD USING THE SAME TO CLEAN GLASS SUBSTRATES

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhixue Dong, Beijing (CN); Wei Li, Beijing (CN); Youngjin Song, Beijing (CN); Kai Yu, Beijing (CN); Zhongfei Bai, Beijing (CN); Qihui Wang, Beijing (CN); Yunliang Zheng, Beijing (CN); Meng Yang, Beijing (CN); Shuangqiang Zhang, Beijing (CN); Xiaoyu Shen, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 157 days.

(21) Appl. No.: 14/518,401

(22) Filed: Oct. 20, 2014

(65) Prior Publication Data

US 2015/0336137 A1 Nov. 26, 2015

(30) Foreign Application Priority Data

May 26, 2014 (CN) .......................... 2014 1 0225141

(51) Int. Cl.
B08B 3/00 (2006.01)
B08B 3/04 (2006.01)
B08B 3/10 (2006.01)
B08B 11/04 (2006.01)
H01L 21/67 (2006.01)

(52) U.S. Cl.
CPC ................ *B08B 3/041* (2013.01); *B08B 3/10* (2013.01); *B08B 11/04* (2013.01); *H01L 21/67028* (2013.01); *H01L 21/67173* (2013.01); *H01L 21/67248* (2013.01)

(58) Field of Classification Search
None
See application file for complete search history.

(56) References Cited

U.S. PATENT DOCUMENTS

2003/0066638 A1* 4/2003 Qu .......................... C09K 5/14
165/186

FOREIGN PATENT DOCUMENTS

| CN | 1485150 | * | 3/2004 |
| CN | 1763916 | A * | 4/2006 |
| JP | 2005256144 | A * | 9/2005 |

* cited by examiner

Primary Examiner — Eric Golightly
(74) Attorney, Agent, or Firm — Brooks Kushman P.C.

(57) ABSTRACT

The present disclosure provides a stripping apparatus including a cleaning device, a transition unit and a stripping device. The cleaning device includes a first cleaning unit, a second cleaning unit and a third cleaning unit. The stripping device is connected with the transition unit; the transition unit is further connected with the first cleaning unit; the first cleaning unit is further connected with the second cleaning unit; the second cleaning unit is further connected with the third cleaning unit. Temperatures of the first cleaning unit, the second cleaning unit and the third cleaning unit are gradually decreased. The temperature of the third cleaning unit is equal to the temperature of water injected into the third cleaning unit.

7 Claims, 4 Drawing Sheets

STRIPPING APPARATUS AND METHOD USING THE SAME TO CLEAN GLASS SUBSTRATES

CROSS-REFERENCE TO RELATED APPLICATION

This application claims priority to Chinese Patent Application No. 201410225141.3 filed on May 26, 2014, the disclosure of which is incorporated in its entirety by reference herein.

TECHNICAL FIELD

The present disclosure relates to the field of manufacturing thin film transistors, and more particularly to a stripping apparatus and a method for using the same to clean glass substrates.

BACKGROUND

In a wet stripping device for manufacturing a thin film transistor liquid crystal display (TFT-LCD), after stripping of a glass substrate in the stripping device, the glass substrate passes through a transition unit and enters into a cleaning device for cleaning. The transition unit is used to prevent water in the cleaning device from flowing back into a stripping section of the stripping device, so as to prevent pollution of stripping liquid. However, the cleaning device in the prior art has a poor cleaning effect of the glass substrate. Therefore, production efficiency of an entire production line may be affected and normal production process may be affected.

SUMMARY

Embodiments of the present disclosure provide a stripping apparatus and a method for using the stripping apparatus to clean glass substrates, which may solve the problem in the prior art that the cleaning device in the prior art has a poor cleaning effect of the glass substrate, and improve production efficiency of an entire production line and ensure normal production process.

In order to achieve the above object, embodiments of the present disclosure adopt following technical solution.

One embodiment of the present disclosure provides a stripping apparatus including a cleaning device, a transition unit and a stripping device;

wherein the cleaning device at least includes a first cleaning unit, a second cleaning unit and a third cleaning unit;

the stripping device is connected with the transition unit; the transition unit is further connected with the first cleaning unit; the first cleaning unit is further connected with the second cleaning unit; the second cleaning unit is further connected with the third cleaning unit;

a temperature in the third cleaning unit is set to be a first parameter; the first parameter is a value equal to a temperature of water injected into the third cleaning unit;

a temperature in the second cleaning unit is set to be a second parameter; the second parameter is a value equal to a sum of the first parameter and an average value obtained by dividing an absolute value of a difference between a temperature of the stripping device and the first parameter by the total number of the cleaning units;

a temperature of the first cleaning unit is set to be a difference between the temperature of the stripping device and the average value.

Optionally, a temperature of the transition unit is set to be equal to the temperature of the first cleaning unit.

Optionally, the cleaning device further includes N additional cleaning units; the total number of the cleaning units includes the number of the cleaning units and the number of the N additional cleaning units;

when N is equal to 1, an N-th additional cleaning unit of the N additional cleaning units is connected with the second cleaning unit; an N-th additional cleaning unit of the N additional cleaning units is connected with the third cleaning unit;

a temperature of the N-th additional cleaning unit of the N additional cleaning units is set to be a sum of the average value and the temperature of the third cleaning unit;

when N is greater than or equal to 2, the N-th additional cleaning unit of the N additional cleaning units is connected with the third cleaning unit; an (N−1)-th additional cleaning unit of the N additional cleaning units is connected with the N-th additional cleaning unit; a first additional cleaning unit of the N additional cleaning units is connected with the second cleaning unit;

a temperature of the Nth additional cleaning unit of the N additional cleaning units is set to be a sum of the average value and the temperature of the third cleaning unit;

a temperature of the (N−1)-th additional cleaning unit of the N additional cleaning units is set to be a sum of the average value and the temperature of the N-th additional cleaning unit;

a temperature of the first additional cleaning unit of the N additional cleaning units is set to be a sum of the average value and the temperature of the second cleaning unit;

the temperature of the second cleaning unit is adjusted to be a sum of the average value and the temperature of the first additional cleaning unit.

Optionally, the stripping apparatus further includes a gas blocking device; wherein the gas blocking device is installed at an initial end of the transition unit and is connected with the stripping device; the initial end is an end of the transition unit close to the stripping device.

Optionally, the stripping apparatus further includes a plurality of water tanks and at least one controller; wherein the water tanks are corresponding to the cleaning units in a one-to-one manner, and are connected with the corresponding cleaning units, respectively;

each of the water tanks includes a temperature measuring instrument, a heating device, a cooling device and a temperature sensor; one terminal of the temperature sensor is coupled with the temperature measuring instrument; another terminal of the temperature sensor is coupled with a terminal of the controller; the heating device and the cooling device are coupled with another two terminals of the controller, respectively.

Optionally, an absolute value of a difference between the average value and a difference of the temperature of the second cleaning unit and the temperature of the third cleaning unit is in a preset threshold range;

an absolute value of a difference between the average value and a difference of the temperature of the second cleaning unit and the temperature of the first cleaning unit is in the preset threshold range.

Optionally, an absolute value of a difference between the average value and a difference of the temperature of the N-th additional cleaning unit and the temperature of the third cleaning unit is in a preset threshold range;

an absolute value of a difference between the average value and a difference of the temperature of the (N−1)-th additional cleaning unit and the temperature of the N-th additional cleaning unit is in the preset threshold range;

an absolute value of a difference between the average value and a difference of the temperature of the second cleaning unit and the temperature of the first additional cleaning unit is in the preset threshold range.

One embodiment of the present disclosure provides a method for using a stripping apparatus to clean a glass substrate, wherein the stripping apparatus includes a cleaning device, a transition unit and a stripping device; the cleaning device at least includes a first cleaning unit, a second cleaning unit and a third cleaning unit; the stripping device is connected with the transition unit; the transition unit is further connected with the first cleaning unit; the first cleaning unit is further connected with the second cleaning unit; the second cleaning unit is further connected with the third cleaning unit;

the method includes:

after completion of stripping of the glass substrate in the stripping device, transporting the glass substrate to the cleaning device through the transition unit;

controlling temperatures of the first cleaning unit, the second cleaning unit and the third cleaning unit of the cleaning device to be a first parameter, a second parameter and a third parameter, respectively;

passing the glass substrate through the first cleaning unit, the second cleaning unit and the third cleaning unit, and cleaning the glass substrate in the first cleaning unit, the second cleaning unit and the third cleaning unit;

wherein the first parameter is a value equal to a temperature of water injected into the third cleaning unit;

when the cleaning device includes three cleaning units, the second parameter is a value equal to a sum of the first parameter and an average value obtained by dividing an absolute value of a difference between a temperature of the stripping device and the first parameter by the total number of the cleaning units;

the third parameter is a difference between the temperature of the stripping device and the average value.

Optionally, the transporting the glass substrate to the cleaning device through the transition unit includes:

controlling a temperature of the transition unit to be equal to a temperature of the first cleaning unit; and transporting the glass substrate to the cleaning device through the transition unit.

Optionally, the stripping apparatus further includes a gas blocking device; wherein the gas blocking device is installed at an end of the transition unit close to the stripping device and is connected with the stripping device; the gas blocking device includes a plurality of holes;

wherein the transporting the glass substrate to the cleaning device through the transition unit includes:

applying pressured gas to the glass substrate via the holes of the gas blocking device.

Optionally, the transition unit includes a spraying device;

the transporting the glass substrate to the cleaning device through the transition unit includes:

spraying water on the glass substrate through the spraying device.

Optionally, the stripping device further includes a plurality of water tanks and at least one controller; wherein the water tanks are corresponding to the cleaning units in a one-to-one manner, and are connected with the corresponding cleaning units, respectively;

each of the water tanks includes a temperature measuring instrument, a heating device, a cooling device and a temperature sensor; one terminal of the temperature sensor is coupled with the temperature measuring instrument; another terminal of the temperature sensor is coupled with a terminal of the controller; the heating device and the cooling device are coupled with another two terminals of the controller, respectively;

the temperatures of the first cleaning unit, the second cleaning unit and the third cleaning unit are equal to temperatures of corresponding water tanks, respectively;

the controlling temperatures of the first cleaning unit, the second cleaning unit and the third cleaning unit of the cleaning device to be a first parameter, a second parameter and a third parameter, respectively, includes:

measuring in real time temperature of each of the water tanks using the temperature measuring instrument in each of the water tanks, and sending a measured result to the temperature sensor in each of the water tanks;

when the temperature sensor in each of the water tanks detects that the temperature of the corresponding water tank exceeds a preset temperature range, issuing a signal to the controller;

issuing by the controller a control command to the heating device or the cooling device of the corresponding water tank according to the signal, so as to cause the temperatures of the water tanks being maintained at the first parameter, the second parameter and the third parameter, respectively.

Optionally, the cleaning device further includes N additional cleaning units which are connected together; the N additional cleaning units are arranged along a direction from the stripping device to the cleaning device, arranged between the second cleaning unit and the third cleaning unit, and referred as first, second N-th additional cleaning unit, respectively; the first additional cleaning unit is connected with the second cleaning unit; the N-th additional cleaning unit is connected with the third cleaning unit;

the controlling temperatures of the first cleaning unit, the second cleaning unit and the third cleaning unit of the cleaning device to be the first parameter, the second parameter and the third parameter, respectively further includes:

controlling a temperature of an X-th additional cleaning unit of the N additional cleaning units to be:

temperature of the X-th additional cleaning unit=temperature of the third cleaning unit+average value*(N+1−X), where X is greater than or equal to 1, and smaller than or equal to N;

the passing the glass substrate through the first cleaning unit, the second cleaning unit and the third cleaning unit, and cleaning the glass substrate in the first cleaning unit, the second cleaning unit and the third cleaning unit includes:

sequentially passing the glass substrate through the first cleaning unit, the second cleaning unit, the first additional cleaning unit, the N-th additional cleaning unit, and the third cleaning unit, and cleaning the glass substrate in the first cleaning unit, the second cleaning unit, the first additional cleaning unit, . . . the N-th additional cleaning unit, and the third cleaning unit.

In the stripping apparatus and the method for using the stripping apparatus to clean glass substrates provided in embodiments of the present disclosure, temperatures of the various cleaning units of the cleaning device of the stripping apparatus may be set to be gradually decreased along a direction from the stripping device to the cleaning device, and this may solve the problem in the prior art that the cleaning device in the prior art has a poor cleaning effect of the glass substrates. Therefore, production efficiency of an entire production line may be improved and normal production process may be ensured.

BRIEF DESCRIPTION OF THE DRAWINGS

In order to illustrate technical solutions according to the embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

In order to make objects, technical details and advantages of the embodiments of the present disclosure apparent, hereinafter, the technical solutions of the embodiments of the present disclosure will be described in a clearly and fully understandable way in connection with the drawings related to the embodiments of the present disclosure. It is obvious that the described embodiments are just a part but not all of the embodiments of the present disclosure. Based on the described embodiments of the present disclosure, those ordinarily skilled in the art can obtain other embodiment(s), without any inventive work, which should be within the scope sought for protection by the present disclosure.

In the process of carrying out the present disclosure, inventors find that in a stripping process in the prior art, a temperature of stripping liquid and a stripping section is usually 60°, and a temperature of a watering section of the cleaning device is usually 23°. Thus, when the glass substrate suddenly enters into an environment of 23° from an environment of 60°, there is a greatly temperature drop, resulting in poor cleaning effect of the glass substrate. Therefore, the production process is affected, and then production efficiency of an entire production line is affected.

One embodiment of the present disclosure provides a stripping apparatus which may solve the problem in the prior art that the existing cleaning device has a poor cleaning effect of glass substrates, improve production efficiency of an entire production line and ensure normal production process.

Figure 1:
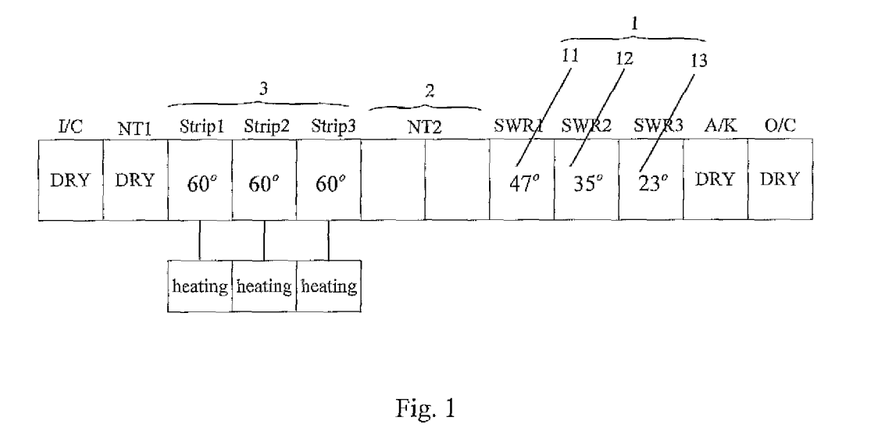
FIG. 1 is a schematic diagram showing a structure of a stripping apparatus according to one embodiment of the present disclosure.

Referring to FIG. 1, the stripping apparatus includes a cleaning device 1, a transition unit 2 and a stripping device 3. The transition unit 2 is arranged between the cleaning device 1 and the stripping device 3, and is connected with the cleaning device 1 and the stripping device 3, respectively.

The cleaning device 1 at least includes a first cleaning unit 11, a second cleaning unit 12 and a third cleaning unit 13.

In one embodiment, the stripping device 3 is connected with the transition unit 2; the transition unit 2 is further connected with the first cleaning unit 11; the first cleaning unit 11 is further connected with the second cleaning unit 12; the second cleaning unit 12 is further connected with the third cleaning unit 13.

The transition unit 2 may be used to prevent water in the first, second third cleaning units, 11, 12, 13 from flowing back into the stripping device 3, so as to prevent pollution of stripping liquid which may affect stripping effects.

A temperature in the third cleaning unit 13 is set to be a first parameter.

The first parameter is a value equal to a temperature of water injected into the third cleaning unit 13.

A temperature in the second cleaning unit 12 is set to be a second parameter.

The second parameter is a value equal to a sum of the first parameter and an average value obtained by dividing a difference between a temperature of the stripping device 3 and the first parameter by the total number of the cleaning units, and may be expresses with a following formula:

the second parameter=(temperature of the stripping device−first parameter)/number of the cleaning units+first parameter.

A temperature of the first cleaning unit 11 is set to be a sum of the above average value and the second parameter, i.e., a third parameter.

As shown in FIG. 1, the temperature of water, i.e., 23°, injected into the cleaning device commonly used in the prior art, is taken as an example of the temperature of the water in the third cleaning unit 13 for illustration. Of course, the temperature of the water injected into the third cleaning unit 13 is not limited to 23° here, any water temperature which may achieve effective cleaning of the glass substrates may be adopted. The temperature of stripping liquid, i.e., 60°, commonly used in the prior art, is taken as an example of the temperature of the stripping device 3 for illustration. Of course, the temperature of the stripping device 3 is not limited to 60° here, any water temperature which may achieve effective stripping of the glass substrates without changing properties of the stripping liquid may be adopted.

In the stripping apparatus provided in one embodiment of the present disclosure, temperatures of the various cleaning units 11, 12, 13 of the cleaning device 1 of the stripping apparatus may be set to be gradually decreased along a direction from the stripping device 3 to the cleaning device 1, and this may solve the problem in the prior art that since the temperature difference between the temperature of the cleaning device and the temperature of the stripping device is larger, thus there is a greatly temperature drop when the glass substrate passes through the transition unit and enters into the cleaning device for cleaning, resulting in poor cleaning effect. Therefore, the stripping apparatus provided in one embodiment of the present disclosure may improve production efficiency of an entire production line and ensure normal production process.

Figure 2:
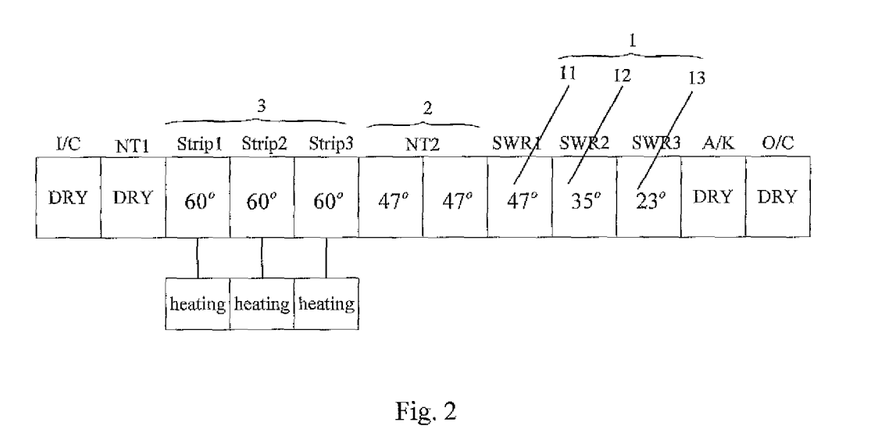
FIG. 2 is a schematic diagram showing a structure of a stripping apparatus according to another embodiment of the present disclosure.

Further, referring to FIG. 2, a temperature in the transition unit 2 may be set to be the same as that of the first cleaning unit 11.

Further, the cleaning device 1 of the stripping apparatus further includes N additional cleaning units.

When N is equal to 1, an N-th additional cleaning unit of the N additional cleaning units is connected with the second cleaning unit 12; the N-th additional cleaning unit of the N additional cleaning units is connected with the third cleaning unit 13.

A temperature of the N-th additional cleaning unit of the N additional cleaning units may be set to be a sum of the average value and the temperature of the third cleaning unit 13.

When N is greater than or equal to 2, the N-th additional cleaning unit of the N additional cleaning units is connected with the third cleaning unit 13; an (N−1)-th additional cleaning unit of the N additional cleaning units is connected with the N-th additional cleaning unit. A first additional cleaning unit of the N additional cleaning units is connected with the second cleaning unit 12.

A temperature of the N-th additional cleaning unit of the N additional cleaning units may be set to be a sum of the average value and the temperature of the third cleaning unit 13.

A temperature of the (N−1)-th additional cleaning unit of the N additional cleaning units may be set to be a sum of the average value and the temperature of the N-th additional cleaning unit.

A temperature of the first additional cleaning unit of the N additional cleaning units may be set to be equal to a difference between the average value and the temperature of the second cleaning unit 12.

In one embodiment, the N additional cleaning units are arranged from the direction from the stripping device 3 to the cleaning device 1, arranged between the second cleaning unit 12 and the third cleaning unit 13, and may be referred as first, second . . . N-th additional cleaning unit, respectively. The first additional cleaning unit is connected with the second cleaning unit 12; the N-th additional cleaning unit is connected with the third cleaning unit 13. A temperature of an X-th additional cleaning unit of the N additional cleaning units may be expressed with a following formula:

temperature of the X-th additional cleaning unit=temperature of the third cleaning unit+ average value*(N+1−X),where X is greater than or equal to 1 and smaller than or equal to N.

Figure 3:
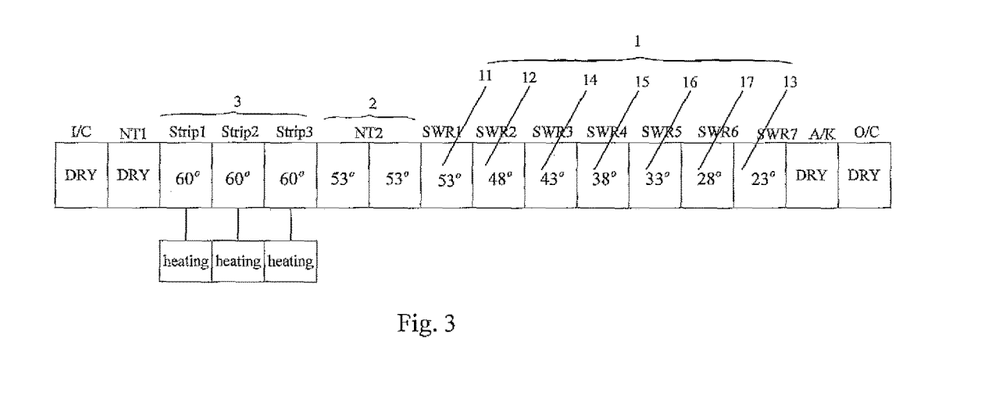
FIG. 3 is a schematic diagram showing a structure of a stripping apparatus according to yet another embodiment of the present disclosure.

Specifically, referring to FIG. 3, as an example for illustration, the cleaning device 1 further include four additional cleaning units.

A first additional cleaning unit 14 is connected with the second cleaning unit 12; a second additional cleaning unit 15 is connected with the first additional cleaning unit 14; a third additional cleaning unit 16 is connected with the second additional cleaning unit 15; the fourth additional cleaning unit 17 is connected with the third additional cleaning unit 16. Meanwhile, the fourth additional cleaning unit 17 is connected with the third cleaning unit 13.

A temperature of the fourth additional cleaning unit 17 may be set to be a sum of the average value and the temperature of the third cleaning unit 13.

A temperature of the third additional cleaning unit 16 may be set to be a sum of the average value and the temperature of the fourth additional cleaning unit 17.

A temperature of the second additional cleaning unit 15 may be set to be a sum of the average value and the temperature of the third additional cleaning unit 16.

A temperature of the first additional cleaning unit 14 may be set to be a sum of the average value and the temperature of the second additional cleaning unit 15.

A temperature of the second cleaning unit 12 may be set to be a sum of the average value and the temperature of the first additional cleaning unit 14.

Here, a calculation method of the average value is the same as that of the above embodiment, that is, the average value is obtained by dividing an absolute value of a difference between the temperature of the stripping device 3 and the first parameter by the total number of the cleaning units of the cleaning device 1.

An absolute value of a difference between the average value and a difference of the temperature of the second cleaning unit 12 and the temperature of the third cleaning unit 13 is in a preset threshold range.

An absolute value of a difference between the average value and a difference of the temperature of the second cleaning unit 12 and the temperature of the first cleaning unit 11 is in the preset threshold range.

An absolute value of a difference between the average value and a difference of the temperature of the N-th additional cleaning unit and the temperature of the third cleaning unit 13 is in the preset threshold range.

An absolute value of a difference between the average value and a difference of the temperature of the (N−1)-th additional cleaning unit and the temperature of the N-th additional cleaning unit is in the preset threshold range.

The number of the cleaning units in the cleaning device 1 is not a fixed value; in actual production, a suitable number of cleaning units may be selected to clean glass substrates, according to requirements of production, actual size of glass substrates to be cleaned, cleaning effect to be achieved, and other factors. Of course, in actual application, the number of the cleaning units may be selected to be 7.

An absolute value of a difference between the average value and a difference of the temperature of the second cleaning unit 12 and the temperature of the first additional cleaning unit 14 is in the preset threshold range.

Figure 5:
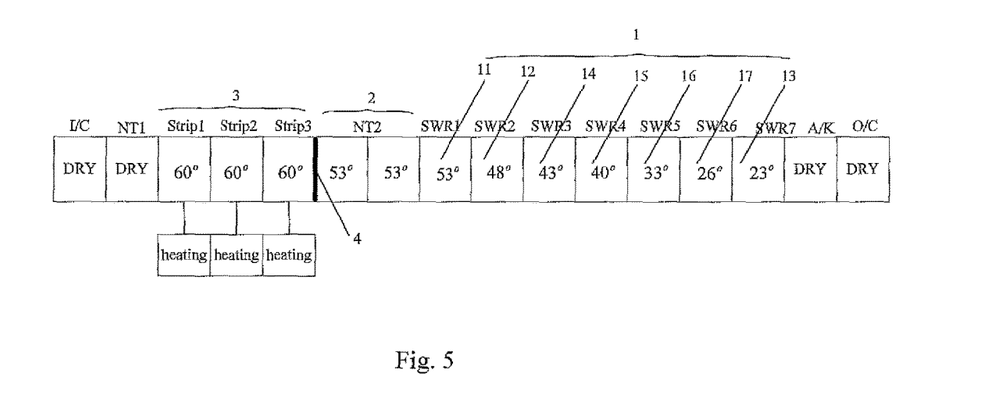
FIG. 5 is a schematic diagram showing a structure of a stripping apparatus according to still yet another embodiment of the present disclosure.

FIG. 5 shows that an absolute value of a difference between the average value and an absolute value of a difference of temperatures of adjacent cleaning units may be in a preset threshold range. That is, as example for illustration, the cleaning device 1 further includes four additional cleaning units; as shown in FIG. 5, the temperature of the fourth additional cleaning unit 17 may be set to be 26°, and the temperature of the second additional cleaning unit 15 may be set to be 40°. A preset threshold is a most suitable temperature range obtained according to actual production practice, and may be, for example, 2. Of course, it is not limited to 2, and a suitable value may be selected for the preset threshold according to actual situations.

It should be noted, the temperatures of the fourth additional cleaning unit 17, the third additional cleaning unit 16 may also be set to the same as that of the third cleaning unit 13.

Figure 4:
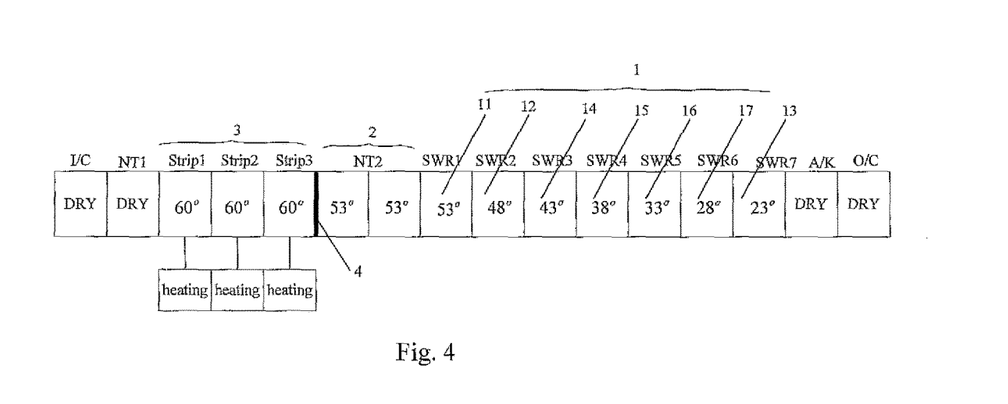
FIG. 4 is a schematic diagram showing a structure of a stripping apparatus according to still another embodiment of the present disclosure.

Further, referring to FIG. 4, the stripping apparatus further includes a gas blocking device 4.

The gas blocking device 4 is installed at an initial end of the transition unit 2, i.e., one end of the transition unit 2 close to the stripping device 3, and is connected with the stripping device 3.

Figure 6:
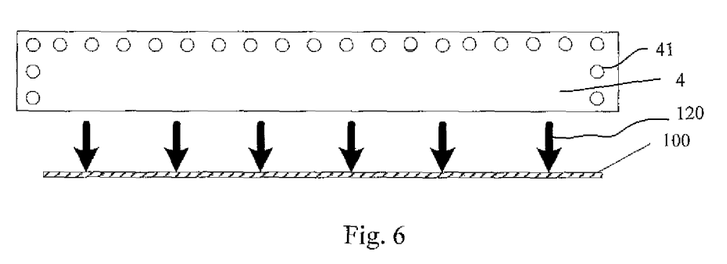
FIG. 6 is a schematic diagram showing a structure of a gas blocking device according to one embodiment of the present disclosure.

Specifically, referring to FIG. 6, the gas blocking device 4 applies pressured gas 120 to a glass substrate 100 which has been stripped by the stripping device 3, through holes 41 of the gas blocking device 4, to prevent water in the cleaning device 1 and the transition unit 2 from flowing back into the stripping device 3, so as to prevent pollution of stripping liquid which may affect stripping effects.

Figure 7:
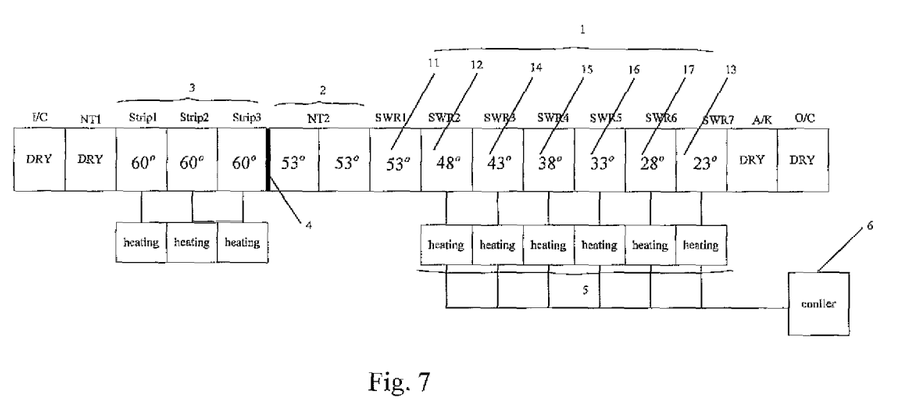
FIG. 7 is a schematic diagram showing a structure of a stripping apparatus according to still yet another embodiment of the present disclosure.

Further, referring to FIG. 7, the stripping apparatus further includes a plurality of water tanks 5 and a controller 6.

The water tanks 5 are corresponding to the cleaning units 11-17 in a one-to-one manner, and are connected with the corresponding cleaning units 11-17, respectively.

The water tanks 5 are used to inject water into corresponding cleaning units 11-17, respectively. In one embodiment, temperatures of water injected by the water tanks 5 to the corresponding cleaning units 11-17 are equal to the temperatures of corresponding cleaning units 11-17, respectively.

Figure 8:
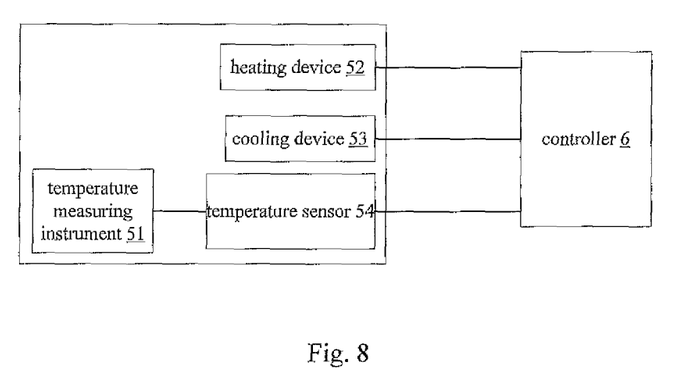
FIG. 8 is a schematic diagram showing structures of water tanks and a controller according to one embodiment of the present disclosure.

Specifically, referring to FIG. 8, each water tank 5 includes a temperature measuring instrument 51, a heating device 52, a cooling device 53 and a temperature sensor 54.

One terminal of the temperature sensor 54 is coupled with the temperature measuring instrument 51; another terminal of the temperature sensor 54 is coupled with a terminal of the controller 6. The heating device 52 and the cooling device 53 are coupled with another two terminals of the controller 6, respectively.

In actual application, the temperature measuring instrument 51 measures in real time the temperature of the water tank 5, and sends a measured result to the temperature sensor 54. When the temperature sensor 54 detects that the temperature of the water tank 5 exceeds a preset range, the temperature sensor 54 issues signal to the controller 6. According to the signal, the controller 6 issues a control command to the heating device 52 or the cooling device 53, so as to ensure that the temperature of the water tank 5 is maintained within a preset temperature range.

In one embodiment, the heating device 52 may be a heating rod. The cooling device 53 may achieve cooling function by injecting cooled water in a condenser. The controller 6 may be a programmable logic controller (PLC). FIG. 8 only gives an example of positions of the temperature measuring instrument 51, the heating device 52, the cooling device 53 and the temperature sensor 54 in the water tank 5. In actual application, the positions of the temperature measuring instrument 51, the heating device 52, the cooling device 53 and the temperature sensor 54 in the water tank 5 are not specifically limited, so long as they may connected together and achieve their functions.

Figure 9:
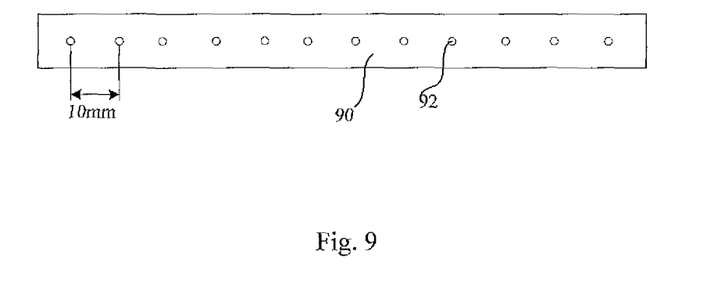
FIG. 9 is a schematic diagram showing a structure of a spraying device according to one embodiment of the present disclosure.

Referring to FIG. 9, the transition unit 2 of the stripping apparatus may further include a spraying device 90. FIG. 9 shows structures of the spraying device 90. Since the glass substrate has a high temperature when leaving from the stripping device 3, stripping liquid attached on the glass substrate may be solidified on the glass substrate when passing through the transition unit 2. When the glass substrate is cleaned by the cleaning device 1, it is difficult to clean the glass substrate, thereby affecting cleaning effects. By installation of the spraying device 90 on an upper part of the transition unit 2, when the glass substrate is going through the transition unit 2, water is continuously spraying on the glass substrate 2 to prevent the stripping liquid from being solidified on the glass substrate. A distance between adjacent spraying holes 92 in the spraying device 90 may be set to be 5 mm, 10 mm, 20 mm, 30 mm, etc., this may ensure that the water from the spraying device 90 may effectively cover the whole glass substrate when the glass substrate is going through the transition unit 2.

Of course, here, it is only an example for illustrating the size of the distance between adjacent spraying holes 92 of the spraying device 90, and the distance is not limited to 5 mm, 10 mm, 20 mm, 30 mm. In actual application, a suitable value may be selected as the size of the distance between adjacent spraying holes 92 of the spraying device 90 according to actual execution environment.

In the stripping apparatus of one embodiment of the present disclosure, the temperatures of the various cleaning units of the cleaning device 1 are gradually decreased from an input end of the cleaning device 1 (i.e., one end of the cleaning device 1 connected with the transition unit 2) to an outlet end of the cleaning device 1 (i.e., one end of the cleaning device 1 opposite to the inlet end), so that a difference between a temperature at which the glass substrate 100 initially enters into the cleaning device 1 and the temperature of the stripping device 3 is not larger. Thus, adverse affects on the glass substrate 100 caused due to a great temperature drop may be reduced. The glass substrate 100 slowly adapts the temperature change in the cleaning device 1 until the glass substrate 100 has adapted the temperature change in the cleaning device 1. This may ensure that the cleaning device 1 has a good cleaning effect of glass substrates.

Changes on the temperatures of water injected from the water tanks 5 of the cleaning device 1 to corresponding cleaning units may be measured by the corresponding temperature measuring instruments 51 such as thermal thermometer. Of course, other thermal measuring instrument which may achieve the above function may also be adopted. A preset temperature range is set for the temperature sensor 54 in advance. When the temperature measuring instrument 51 measures a temperature of one of the water tanks 5 corresponding to any of the cleaning units, the temperature measuring instruments 51 sends the measured temperature to the temperature sensor 54. When the temperature sensor 54 detects that the temperature exceeds the preset temperature range, the temperature sensor 54 issues signal to the controller 6. According to the signal, the controller 6 issues a control command to the heating device 52 such as a heating rod or the cooling device 53. The heating device 52 such as a heating rod or the cooling device 53 may perforin corresponding operations according to actual temperature changes, so as to maintain the temperatures of water injected into the various cleaning units within a temperature range which satisfies conditions.

In the stripping apparatus provided in one embodiment of the present disclosure, temperatures of the various cleaning units of the cleaning device in the stripping apparatus may be set to be gradually decreased along the direction from the stripping device 3 to the cleaning device 1, and this may solve the problem in the prior art that since the temperature difference between the temperature of the cleaning device and the temperature of the stripping device is larger, thus there is a greatly temperature drop when the glass substrate passes through the transition unit and enters into the cleaning device for cleaning, resulting in poor cleaning effect. Therefore, the stripping apparatus provided in one embodiment of the present disclosure may improve production efficiency of an entire production line and ensure normal production process.

Figure 10:
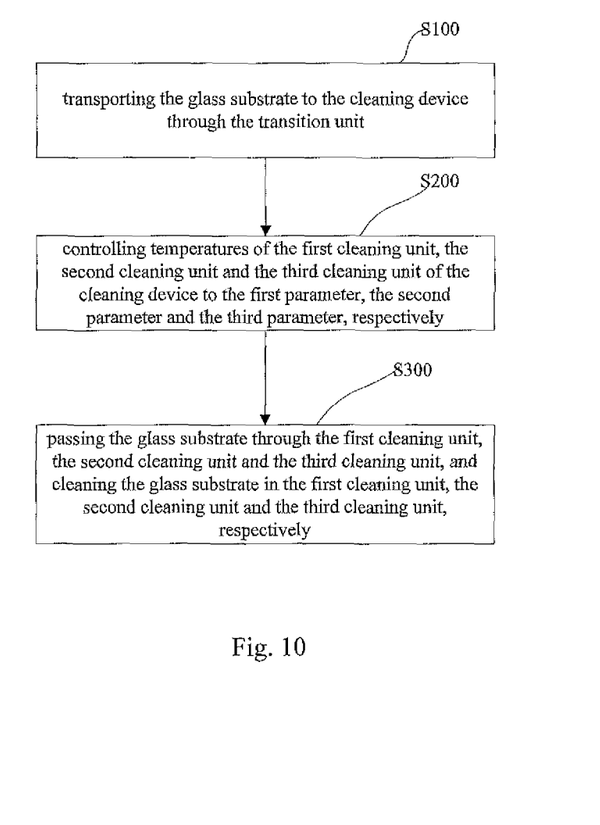
FIG. 10 is a flow chart of a method for using one of the above stripping apparatus to clean glass substrates according to one embodiment of the present disclosure.

One embodiment of the present disclosure further provides a method for using the above stripping apparatus to clean a glass substrate. As shown in FIG. 10 in combination with FIGS. 1-9, the method includes:

S100: after completion of stripping of the glass substrate 100 in the stripping device 3, transporting the glass substrate 100 to the cleaning device 1 through the transition unit 2;

S200: controlling temperatures of the first cleaning unit 11, the second cleaning unit 12 and the third cleaning unit 13 of the cleaning device 1 to be the first parameter, the second parameter and the third parameter, respectively;

S300: passing the glass substrate 100 through the first cleaning unit 11, the second cleaning unit 12 and the third cleaning unit 13, and cleaning the glass substrate 10 in the first cleaning unit 11, the second cleaning unit 12 and the third cleaning unit 13.

As described above, since the first parameter, the second parameter and the third parameter are arranged along a direction from the cleaning device 1 to the stripping device 3, and are gradually decreased along the direction from the stripping device 3 to the cleaning device 1, so that a difference between a temperature at which the glass substrate 100 initially enters into the cleaning device 1 and a temperature of the stripping device 3 is not larger, thus adverse affects on the glass substrate 100 caused due to a great temperature drop may be reduced. The glass substrate 100 slowly adapts the temperature change in the cleaning device 1 until the glass substrate 100 has adapted the temperature change in the cleaning device 1. This may ensure that the cleaning device 1 has a good cleaning effect of glass substrates.

In one embodiment, the transporting the glass substrate 100 to the cleaning device 1 through the transition unit 2 includes:

controlling a temperature of the transition unit 2 to be equal to a temperature of the first cleaning unit 11; and transporting the glass substrate 100 to the cleaning device 1 through the transition unit 2.

Through this step, the difference between the temperature at which the glass substrate 100 initially enters into the cleaning device 1 and the temperature of the stripping device 3 may be further reduced.

In one embodiment, the transporting the glass substrate 100 to the cleaning device 1 through the transition unit 2 includes:

applying pressured gas to the glass substrate 100 via holes 41 of the gas blocking device 4.

In this step, the gas blocking device 4 applies pressured gas 120 to the glass substrate 100 which has been stripped by the stripping device 3, through holes 41 of the gas blocking device 4, to prevent water in the cleaning device 1 and the transition unit 2 from flowing back into the stripping device 3, so as to prevent pollution of stripping liquid which may affect stripping effects.

In one embodiment, the transporting the glass substrate 100 to the cleaning device 1 through the transition unit 2 includes:

spraying water on the glass substrate 100 through the spraying device 90.

In this step, when the glass substrate 100 is going through the transition unit 2, water is continuously spraying on the glass substrate 2 by the spraying device 90 to prevent the stripping liquid from being solidified on the glass substrate 100.

In one embodiment, the controlling temperatures of the first cleaning unit 11, the second cleaning unit 12 and the third cleaning unit 13 of the cleaning device 1 to be the first parameter, the second parameter and the third parameter, respectively includes:

measuring in real time temperature of each water tank 5 using a temperature measuring instrument 51 in each water tank 5, and sending a measured result to the temperature sensor 54 in each water tank 5;

when the temperature sensor 54 of one water tank 5 detects that the temperature of the corresponding water tank exceeds a preset temperature range, issuing by the temperature sensor 54 signal to the controller 6;

issuing by the controller 6 a control command to the heating device 52 or the cooling device 53 of the corresponding water tank 5 according to the signal, so as to cause the temperatures of the water tanks 5 being maintained at the first parameter, the second parameter and the third parameter, respectively.

In one embodiment, the cleaning device 1 further includes N additional cleaning units which are connected together. The N additional cleaning units are arranged along the direction from the stripping device 3 to the cleaning device 1, arranged between the second cleaning unit 12 and the third cleaning unit 13, and may be referred as first, second . . . N-th additional cleaning unit, respectively. The first additional cleaning unit is connected with the second cleaning unit 12; the N-th additional cleaning unit is connected with the third cleaning unit 13.

The controlling temperatures of the first cleaning unit 11, the second cleaning unit 12 and the third cleaning unit 13 of the cleaning device 1 to be the first parameter, the second parameter and the third parameter, respectively further includes:

controlling a temperature of an X-th additional cleaning unit of the N additional cleaning units to be:

temperature of the X-th additional cleaning unit=temperature of the third cleaning unit+average*(N+1−X),where X is greater than or equal to 1, and smaller than or equal to N.

Those described above are only embodiments of the present disclosure, but shall not be used to limit the present disclosure. For those skilled in the art, some modifications and alterations may be made without departing from the basic concept and the scope of the present disclosure, and these should fall within the scope of the present disclosure. Thus, the protection scope of the present disclosure should be based on the claims.

What is claimed is:

1. A stripping apparatus comprising: a cleaning device, a transition unit, a stripping device and at least one controller;

wherein the cleaning device at least comprises a first cleaning unit, a second cleaning unit and a third cleaning unit;

the stripping device is connected with the transition unit; the transition unit is further connected with the first cleaning unit; the first cleaning unit is further connected with the second cleaning unit; the second cleaning unit is further connected with the third cleaning unit;

the controller is configured to control temperatures of the third cleaning unit, the second cleaning unit and the first cleaning unit of the cleaning device to be a first parameter, a second parameter and a third parameter, respectively;

wherein the first parameter is a value equal to a temperature of water injected into the third cleaning unit;

the second parameter is a value equal to a sum of the first parameter and an average value obtained by dividing an absolute value of a difference between a temperature of the stripping device and the first parameter by the total number of the cleaning units; and the third parameter is a difference between the temperature of the stripping device and the average value.

2. The stripping apparatus according to claim 1, further comprising a plurality of water tanks;

wherein the water tanks are corresponding to the cleaning units in a one-to-one manner, and are connected with the corresponding cleaning units, respectively;

each of the water tanks comprises a temperature measuring instrument, a heating device, a cooling device and a temperature sensor; one terminal of the temperature sensor is coupled with the temperature measuring instrument; another terminal of the temperature sensor is coupled with a terminal of the controller; and the heating device and the cooling device are coupled with another two terminals of the controller, respectively.

3. The stripping apparatus according to claim 1, further comprising a gas blocking device; wherein the gas blocking device is installed at an initial end of the transition unit and is connected with the stripping device;

the initial end is an end of the transition unit close to the stripping device.

4. The stripping apparatus according to claim 3, wherein the transition unit comprises a spraying device for spraying water.

5. A method for using the stripping apparatus according to claim 1 to clean a glass substrate, comprising:

after completion of stripping of the glass substrate in the stripping device, transporting the glass substrate to the cleaning device through the transition unit;

controlling temperatures of the third cleaning unit, the second cleaning unit and the first cleaning unit of the cleaning device to be a first parameter, a second parameter and a third parameter, respectively;

passing the glass substrate through the first cleaning unit, the second cleaning unit and the third cleaning unit, and cleaning the glass substrate in the first cleaning unit, the second cleaning unit and the third cleaning unit;

wherein the first parameter is a value equal to a temperature of water injected into the third cleaning unit; the second parameter is a value equal to a sum of the first parameter and an average value obtained by dividing an absolute value of a difference between a temperature of the stripping device and the first parameter by the total number of the cleaning units; and the third parameter is a difference between the temperature of the stripping device and the average value.

6. The method according to claim 5, wherein the stripping apparatus further comprises a gas blocking device; wherein the gas blocking device is installed at an end of the transition unit close to the stripping device and is connected with the stripping device; and the gas blocking device comprises a plurality of holes;

wherein the transporting the glass substrate to the cleaning device through the transition unit comprises:

applying pressured gas to the glass substrate via the holes of the gas blocking device.

7. The method according to claim 6, wherein the transition unit comprises a spraying device; and the transporting the glass substrate to the cleaning device through the transition unit comprises:

spraying water on the glass substrate through the spraying device.

* * * * *